(12) United States Patent
Eggum et al.

(10) Patent No.: US 11,551,957 B2
(45) Date of Patent: Jan. 10, 2023

(54) PURGE CONNECTORS AND MODULES FOR A SUBSTRATE CONTAINER

(71) Applicant: ENTEGRIS, INC., Billerica, MA (US)

(72) Inventors: Shawn D. Eggum, Lonsdale, MN (US); Mark V. Smith, Colorado Springs, CO (US); Matthew A. Fuller, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 454 days.

(21) Appl. No.: 16/851,942

(22) Filed: Apr. 17, 2020

(65) Prior Publication Data

US 2020/0343117 A1 Oct. 29, 2020

Related U.S. Application Data

(60) Provisional application No. 62/839,124, filed on Apr. 26, 2019.

(51) Int. Cl.
*H01L 21/673* (2006.01)
*H01L 21/677* (2006.01)
*F16K 27/02* (2006.01)

(52) U.S. Cl.
CPC .... *H01L 21/67393* (2013.01); *F16K 27/0209* (2013.01); *H01L 21/6773* (2013.01); *H01L 21/67373* (2013.01); *H01L 21/67376* (2013.01); *H01L 21/67386* (2013.01); *H01L 21/67766* (2013.01); *H01L 21/67769* (2013.01)

(58) Field of Classification Search
CPC .............. B65D 47/02; H01L 21/67393; H01L 21/67373; H01L 21/67376; H01L 21/67386; H01L 21/6773; H01L 21/67766; H01L 21/67769; F16K 27/0209
USPC ...................................................... 206/213.1
See application file for complete search history.

(56) References Cited

U.S. PATENT DOCUMENTS

| | | | |
|---|---|---|---|
| 7,328,727 B2 | 2/2008 | Tieben | |
| 8,146,623 B2 | 4/2012 | Tieben | |
| 8,727,125 B2 | 5/2014 | Tieben | |
| 2008/0017547 A1* | 1/2008 | Burns | H01L 21/67369 206/711 |
| 2013/0146503 A1* | 6/2013 | Wang | H01L 21/67369 206/710 |
| 2015/0041353 A1 | 2/2015 | Adams | |
| 2016/0038982 A1* | 2/2016 | Sasaki | H01L 21/67772 15/316.1 |
| 2016/0276190 A1* | 9/2016 | Smith | H01L 21/67393 |
| 2017/0271188 A1 | 9/2017 | Fuller | |

(Continued)

FOREIGN PATENT DOCUMENTS

| | | |
|---|---|---|
| CN | 104888551 A | 9/2015 |
| TW | 201427878 A | 7/2014 |
| WO | 2016149517 A1 | 9/2016 |

*Primary Examiner* — Glenn F Myers

(57) ABSTRACT

A substrate container including a plate, a shell, a connector, and a seal, where the connector is threaded and secured via a nut, and the seal contacts each of the shell, plate, and connector. The plate has a recess accommodating an end of the connector and the nut. Field-serviceable, removable purge modules including check valves may be used with the substrate container, and may be secured to the substrate container in the recess in the plate. Filters may be secured to the connector or included in the purge modules. These filters may have diameters larger than an internal diameter of the connector.

20 Claims, 10 Drawing Sheets

(56) References Cited

U.S. PATENT DOCUMENTS

2017/0294329 A1   10/2017  Gregerson
2018/0247849 A1    8/2018  Glavan
2019/0326134 A1* 10/2019  Suzuki .............. H01L 21/67393

* cited by examiner

PURGE CONNECTORS AND MODULES FOR A SUBSTRATE CONTAINER

TECHNICAL FIELD

This disclosure is directed to connectors and purge modules for use in substrate containers such as front opening unified pods (FOUPs), for example, those used in semiconductor manufacturing. More particularly, this disclosure is directed to threaded connectors between a substrate container shell and a conveyor plate, and allowing flow of purge gasses into or out of the substrate container.

BACKGROUND

Substrate containers are used to transport wafers during various stages of a semiconductor manufacturing process. Substrate containers include, for example, front opening unified pods (FOUPs). FOUPs typically include a shell which provides an internal space for holding wafers, and a plate that is used to interface with various conveyors and other devices, for example so that the FOUP can be moved around the processing facility. The shell and the plate are fixed to one another, for example by welding, connectors, etc.

During processing, gasses must be introduced and removed from the FOUP, for example during purge processes. This requires one or more locations at which gas can enter or leave the FOUP.

SUMMARY

This disclosure is directed to connectors and purge modules for use in substrate containers such as front opening unified pods (FOUPs), for example, those used in semiconductor manufacturing. More particularly, this disclosure is directed to threaded connectors between a substrate container shell and a conveyor plate, and allowing flow of purge gasses into or out of the substrate container.

The shell of the substrate container and the plate of the substrate container may be joined by a threaded connector and a seal located between the threaded connector, plate, and shell. The seal may be compressed when a nut is tightened on the threaded connector to fix the plate and the shell to one another. This threaded connector allows a strong connection between shell and plate, needed to maintain dimensions of the substrate container and to allow successful transport and handling of the substrate container.

The connector may be separate from a purge module controlling flow into or out of the substrate container. Removable, field-serviceable components may be used as the purge modules for such a substrate container. These removable, field-serviceable components may be repaired or replaced without affecting the dimensions of the substrate container. These dimensions are very sensitive, particularly for the substrate container to be used in automated positioning and other operations during manufacture of semiconductor wafers. This also allows the units to be serviced or replaced instead of replacing the entire substrate container.

Such connectors can enable the use of filters having larger diameters, reducing resistance to gas flow into and out of the substrate container, for example by allowing filters to be located in the removable, field-serviceable purge modules, or attached to an end of the connector.

In an embodiment, a substrate container includes a container shell having a wall with an opening, and an interior space defined by the wall. The container shell includes a shell opening having a first inner diameter. The substrate container also includes a plate configured to be fixed to the shell. The plate includes a surface, a recess, and an opening located within the recess having a second inner diameter. The substrate container further includes a connector. The connector includes a portion that has an outer diameter smaller than the first and second inner diameters, a hollow portion having a third inner diameter, a first end having an outer diameter larger than the first inner diameter, and a second end having threading. A nut includes threading configured to engage the threading on the second end of the connector. A seal is disposed between the container shell and the plate. The first end of the connector is located on a first side of the container shell, and the second end of the connector, the seal and the plate are located on a second side of the container shell opposite the first side of the container shell. The connector extends through the shell opening and the plate opening. When the nut is threaded onto the connector and tightened, the seal contacts each of the container shell, the plate, and the connector.

In an embodiment, at least one of the threading on the connector and the threading on the nut includes a locking mechanism.

In an embodiment, the seal is an o-ring.

In an embodiment, the connector further includes a filter membrane located at the first end of the connector, a filter grill, and a filter cap configured to mechanically engage the first end of the connector and secure the filter grill and filter membrane to the end of the connector.

In an embodiment, the substrate container further includes a front purge module including a check valve and a nozzle including an end having an outer diameter smaller than the third inner diameter, wherein the front inlet purge module is positioned such that the end of the nozzle is within the hollow portion of the connector. In an embodiment, the front purge module includes a plurality of tabs and the plate includes a plurality of ramped slots configured to accept the tabs of the front inlet purge module. In an embodiment, each of the plurality of tabs includes a recess and the plate includes a plurality of detent ribs configured to engage the recesses.

In an embodiment, the connector includes an outlet having an opening, wherein a center of the opening is offset from a center of the inner diameter of the connector. In an embodiment, a diffuser tube is connected to the outlet.

In an embodiment, when the nut is threaded onto the connector, the nut and the second end of the connector are located entirely within the recess. In an embodiment, a filter membrane is located within the recess. In an embodiment, the filter membrane has a diameter that is larger than the inner diameter of the connector.

In an embodiment, the substrate container includes a rear purge inlet module including a grommet including a check valve, a filter membrane, a grill configured to support the filter membrane, and a rear purge inlet module body. The rear purge inlet module body includes a portion having an inner diameter larger than an outer diameter of the grommet and configured to accept the grommet, and a nozzle having an outer diameter smaller than the third inner diameter. An end of the nozzle is located within the connector. In an embodiment, the grommet is an overmolded grommet including a substrate and an elastomeric component, wherein the substrate comprises at least one of a polycarbonate and carbon nanotubes. The elastomeric component is formed of an elastomer and is overmolded onto the substrate. In an embodiment, the check valve is an umbrella valve. In an embodiment, the filter membrane has a diameter that is larger than the third inner diameter. In an embodiment, the rear inlet purge module body includes a plurality of tabs and the plate includes a plurality of ramped slots each configured to accept one of the plurality of tabs. In an embodiment, the rear inlet purge module body includes a plurality of fingers configured to engage the plate to prevent rotation of the rear purge inlet module when the plurality of tabs are fully within the plurality of slots.

In an embodiment, a front opening unified pod includes a shell including a front opening and an interior space, a plate configured to be fixed to the shell, a connector including a threaded end having an inner diameter, the connector extending through the shell and the plate and secured via a nut at the threaded end, and a replaceable, field-serviceable inlet or outlet module including a check valve and a nozzle having an end with an outer diameter smaller than the inner diameter of the threaded end of the connector. In this embodiment, the replaceable, field-serviceable inlet or outlet module is located in the plate and the end of the nozzle is located within the inner diameter of the threaded end of the connector.

In an embodiment, the replaceable, field-serviceable inlet or outlet module is one selected from the group of a front inlet purge module wherein the check valve is an umbrella check valve configured to allow flow into the shell, a front outlet purge module wherein the check valve is a mechanical check valve configured to allow flow out of the shell, or a rear inlet purge module wherein the check valve is an umbrella check valve configured to allow flow into the shell, the rear inlet purge module further including a grommet and a filter membrane.

DETAILED DESCRIPTION

This disclosure is directed to connectors and purge modules for use in substrate containers such as front opening unified pods (FOUPs), for example, those used in semiconductor manufacturing. More particularly, this disclosure is directed to threaded connectors between a substrate container shell and a conveyor plate, and allowing flow of purge gasses into or out of the substrate container.

A substrate container is a container for carrying semiconductor wafers during transport and/or processing of those wafers. The substrate container may be, for example, a FOUP or a front opening shipping box (FOSB).

Figure 1:
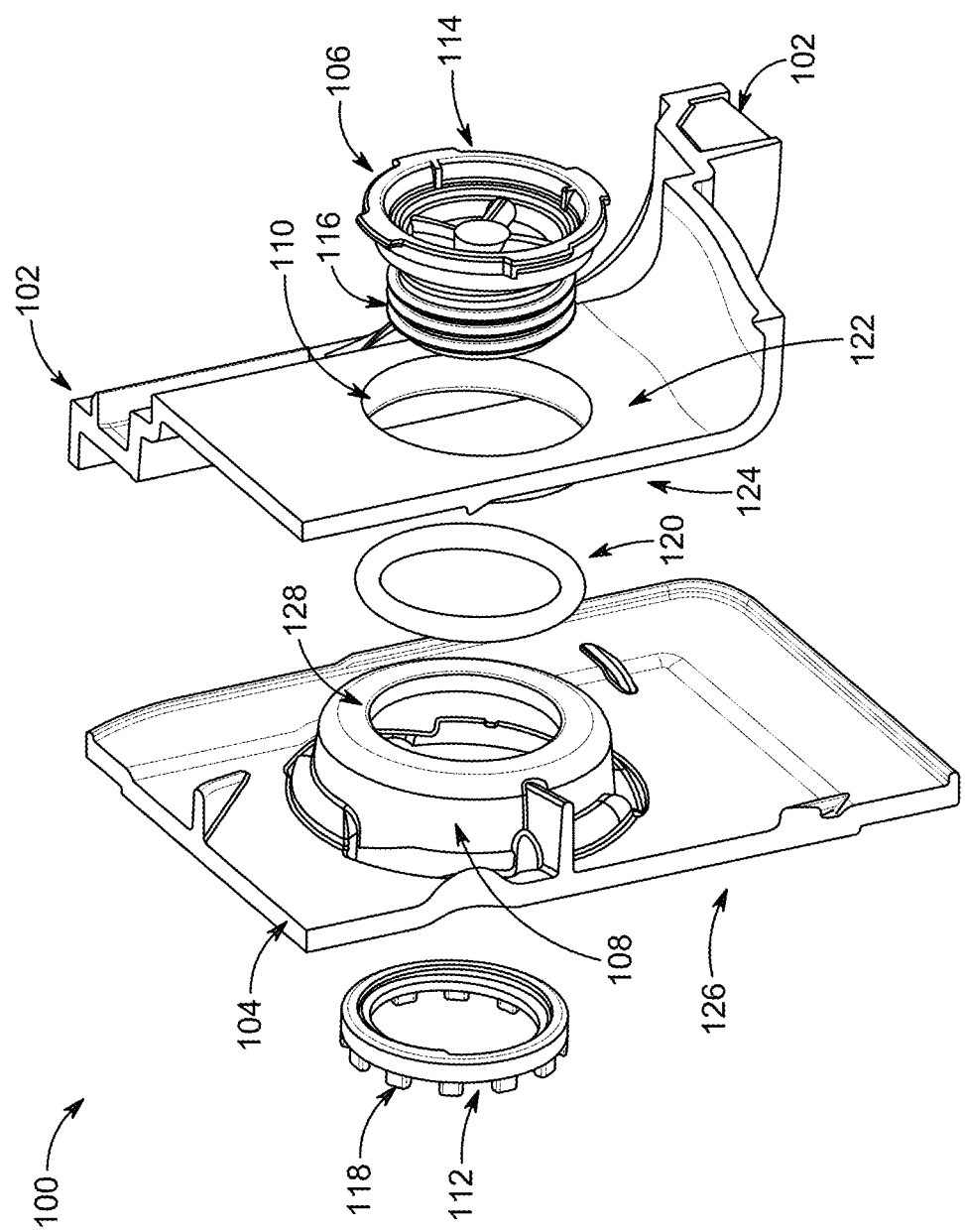
FIG. 1 is an exploded view of a portion of a substrate container where a shell is joined to a plate via a connector according to an embodiment.

FIG. 1 is an exploded view of a portion of a substrate container 100 where a shell 102 is joined to a plate 104 via a connector 106 according to an embodiment. Nut 112 is used with connector 106 to join the shell 102 and plate 104. Seal 120 is disposed between shell 102 and plate 104. Seal 120 may be a polymer seal. In an embodiment, seal 120 is a fluoropolymer seal. In an embodiment, seal 120 is an elastomeric seal. Materials for the seal may be selected based on design aspects including outgassing, particle generation and low volatility.

Shell 102 is part of substrate container 100. Shell 102 may define an internal space where wafers are stored and processed. The internal space of shell 102 may be open on one side where the wafers may be loaded into the shell. A separate covering may allow that open side of the internal space to be closed during wafer processing. Shell 102 may include one or more projections supporting wafers when the wafers are placed within the internal space of shell 102. Shell 102 includes one or more shell openings 110. Each of shell openings 110 may correspond to where a connector 106 joins plate 104 to shell 102. Shell openings 110 may, for example, be provided near corners of one side of the shell 102, such as corners of a bottom side of the shell 102. Each of shell openings 110 may be circular or approximately circular, within manufacturing tolerances and location constraints such as being towards an enclosed rear end of the internal space away from the open side of the internal space. Shell openings may pass through a first side 122 of the shell 102 to a second side 124 of the shell 102. First side 122 may be a side of the shell defining the internal space. Second side 124 may be a side facing plate 104 when shell 102 and plate 104 are assembled to for the substrate container 100.

Plate 104 is a plate connected to shell 102. Plate 104 may be a conveyor plate to facilitate the movement and location of substrate container 100. Plate 104 may include surface 126, facing outwards from shell 102 when plate 104 and shell 102 are assembled to form substrate container 100. Surface 126 of plate 104 may include one or more alignment recesses used to position and support the substrate container 100 on one or more wafer processing devices, such as purge devices or the like. Plate 104 includes one or more recesses 108. Recesses 108 are recessed from surface 126 of plate 104, towards where shell 102 is located when shell 102 and plate 104 are assembled to form substrate container 100. Each of recesses 108 may correspond to where a connector 106 joins plate 104 and shell 102. Each of recesses 108 may include a plate opening 128 where connector 106 may extend through the plate 104. Each of plate openings 128 may be circular or approximately circular, within manufacturing tolerances and location constraints.

Connector 106 may be used to join plate 104 and shell 102. Connector 106 has a first end 114 and a second end 116. First end 114 of connector 106 has a diameter larger than an inner diameter of shell opening 110. First end of 114 may be located within the internal space defined by shell 102 when shell 102, plate 104, and connector 106 are assembled, such that connector 106 retains and restricts movement of shell 102. Second end 116 of connector 106 has an outer diameter smaller than the inner diameter of the shell opening 110 and the plate opening 128 located at recess 108, such that the second end 116 of connector 106 may pass through those openings 110, 128. Second end 116 is threaded with threads configured to engage with threads on nut 112. In an embodiment, when shell 102, plate 104, and connector 106 are assembled, the second end 116 of connector 106 is located entirely within a recess 108 in plate 104.

Connector 106 has a passage through which fluid, such as purge gas (e.g. nitrogen) or gas being purged from substrate container 100 may travel into and out of the internal space defined by shell 102.

Nut 112 may be used with connector 106 to join plate 104 and shell 102. Nut 112 may be threaded, and engage with the threaded second end 116 of connector 106. The threading at one or more of nut 112 and second end 116 of connector 106 may include one or more locking features (not shown). The locking features may include, for example serrated surfaces, bumps, scalloping, or other such features to restrict rotation when the nut 112 is threaded onto the second end 116 of connector 106. In an embodiment, when plate 102, shell 104, and connector 106 are assembled and nut 112 is threaded onto second end 116 of connector 106, nut 112 is entirely within a recess 108 in plate 104. Nut 112 may be, for example, a castle nut, with a plurality of projections 118 for engagement with a tool (not shown) to rotate nut 112 relative to connector 106 when threading nut 112 onto the second end 116 of connector 106.

Shell 102, plate 104, connector 106, and/or nut 112 may be made of polymers such as injection moldable polymers. In an embodiment, shell 102, plate 104, connector 106, and/or nut 112 include one or more polyolefins. In an embodiment, shell 102, plate 104, connector 106, and/or nut 112 include polycarbonate. In an embodiment, polymers used in shell 102, plate 104, connector 106, and/or nut 112 may include carbon fill. In an embodiment, carbon fill included in shell 102, plate 104, connector 106, and/or nut 112 may provide electrostatic dissipation. Shell 102, plate 104, connector 106, and/or nut 112 may be made from a variety of thermoplastic polymeric materials and more particularly, a thermoplastic polymer that is designed to minimize particle shedding. A portion, if not all, of the substrate container can be injection molded.

Seal 120 is a seal restricting the leakage of fluids, such as purge and/or reaction gases between the shell 102, the connector 106, and the plate 104. Seal 120 may be, for example, a flat gasket, an overmolded seal, or an o-ring. Seal 120 may be positioned such that it contacts each of shell 102, connector 106, and plate 104 when shell 102, plate 104, and connector 106 are assembled and nut 112 is threaded onto second end 116 of connector 106 and tightened. In an embodiment, seal 120 is an o-ring positioned around connector 106 and between plate 104 and shell 102 prior to threading nut 112 onto connector 106. In this embodiment, the o-ring is compressed when nut 112 is tightened, pressing the o-ring against each of the shell 102, plate 104, and connector 106.

Figure 2:
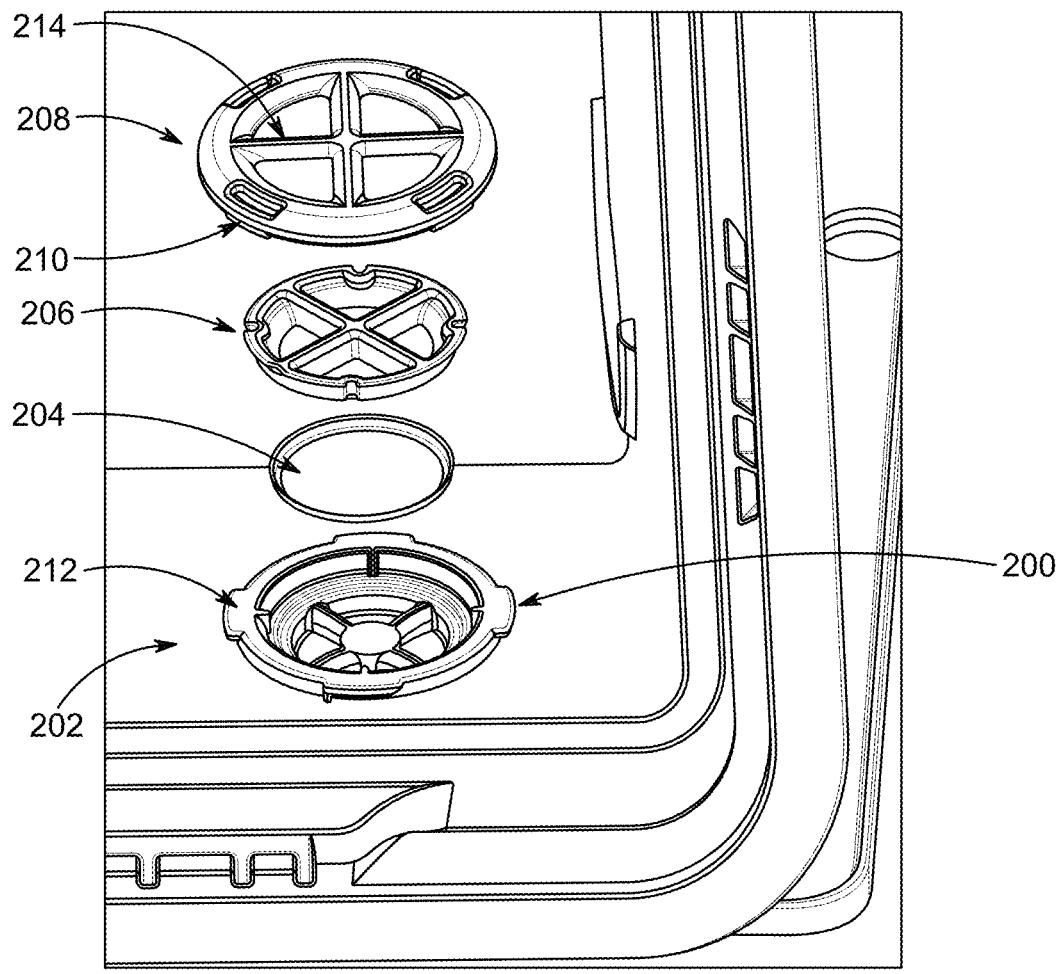
FIG. 2 is an exploded view of a filter connection at a connector within a shell of a substrate container according to an embodiment.

FIG. 2 is an exploded view of a filter connection at an end of a connector 200 within a shell 202 of a substrate container according to an embodiment. The end of a connector 200 may be the first end 114 of a connector such as connector 106 described above and shown in FIG. 1. A filter 204 may be placed onto a connector, such as connector 106 described above and shown in FIG. 1. The diameter of filter 204 may be greater than the inner diameter of the connector. Filter 204 may be, for example, a filter membrane such as a porous polymer filter membrane filter. Filter 204 may be made of one or more polymer materials, with non-limiting examples including polyolefin, polyamides, fluoropolymers, and the like. Filter 204 may be any filter configuration, for example single-layer, multi-layer, laminated, woven, and/or non-woven structures. In an embodiment, filter 204 includes electrostatic media. Filter 204 is held in place by mechanical interference between the end of the connector 200 and filter grill 206. Filter grill 206 may be held in place by filter cap 208. Filter cap 208 includes connectors 210 configured to engage tabs 212 on connector 200. Filter cap 208 may further include detent ribs (not shown) on the underside of spokes 214. The detent ribs on spokes 214 may engage the filter grill 206 to restrict rotation of filter grill 206 and filter cap 208 when filter cap 208 is in position on connector 200.

Figure 3:
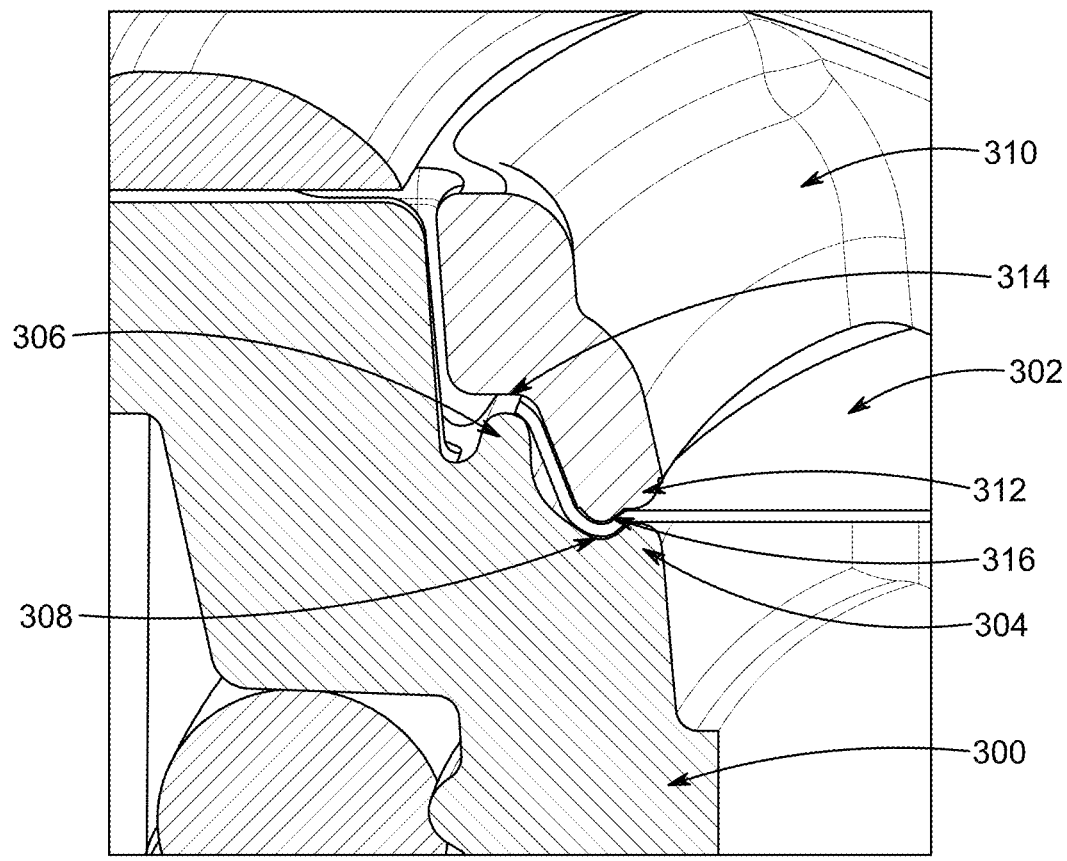
FIG. 3 is a sectional view of a filter and an end of the connector according to an embodiment.

FIG. 3 is a sectional view of a filter 302 and an end of the connector 300 according to an embodiment. The section of FIG. 3 may be taken across a center line of an assembled filter connection such as that shown in the exploded view of FIG. 2. The end of the connector 300 includes first connector lobe 304, second connector lobe 306, and connector recess 308. Each of the first connector lobe 304, second connector lobe 306, and connector recess 308 may be annular. Filter grill 310 includes a first filter grill shoulder 312 aligned with the first connector lobe 304, a second connector shoulder 314 aligned with the second connector lobe 306, and a filter grill lobe 316 aligned with the connector recess 308. When the filter grill 310 is secured to the end of connector 300, for example via a filter cap (such as filter cap 208 described above and shown in FIG. 2), the filter 302 is compressed between the first connector lobe 304 and the first filter grill shoulder 312, the connector recess 308 and the filter grill lobe 316, and the second connector lobe 306 and the second filter grill shoulder 314. The first connector lobe 304 and the first filter grill shoulder 312, the connector recess 308 and the filter grill lobe 316, and the second connector lobe 306 and the second filter grill shoulder 314 may be in that order when moving from the center of the filter 302 to its periphery. This crimps and compresses the filter 302, reducing the escape of a fluid such as, for example a purge gas such as nitrogen through the edges of the filter 302.

Figure 4:
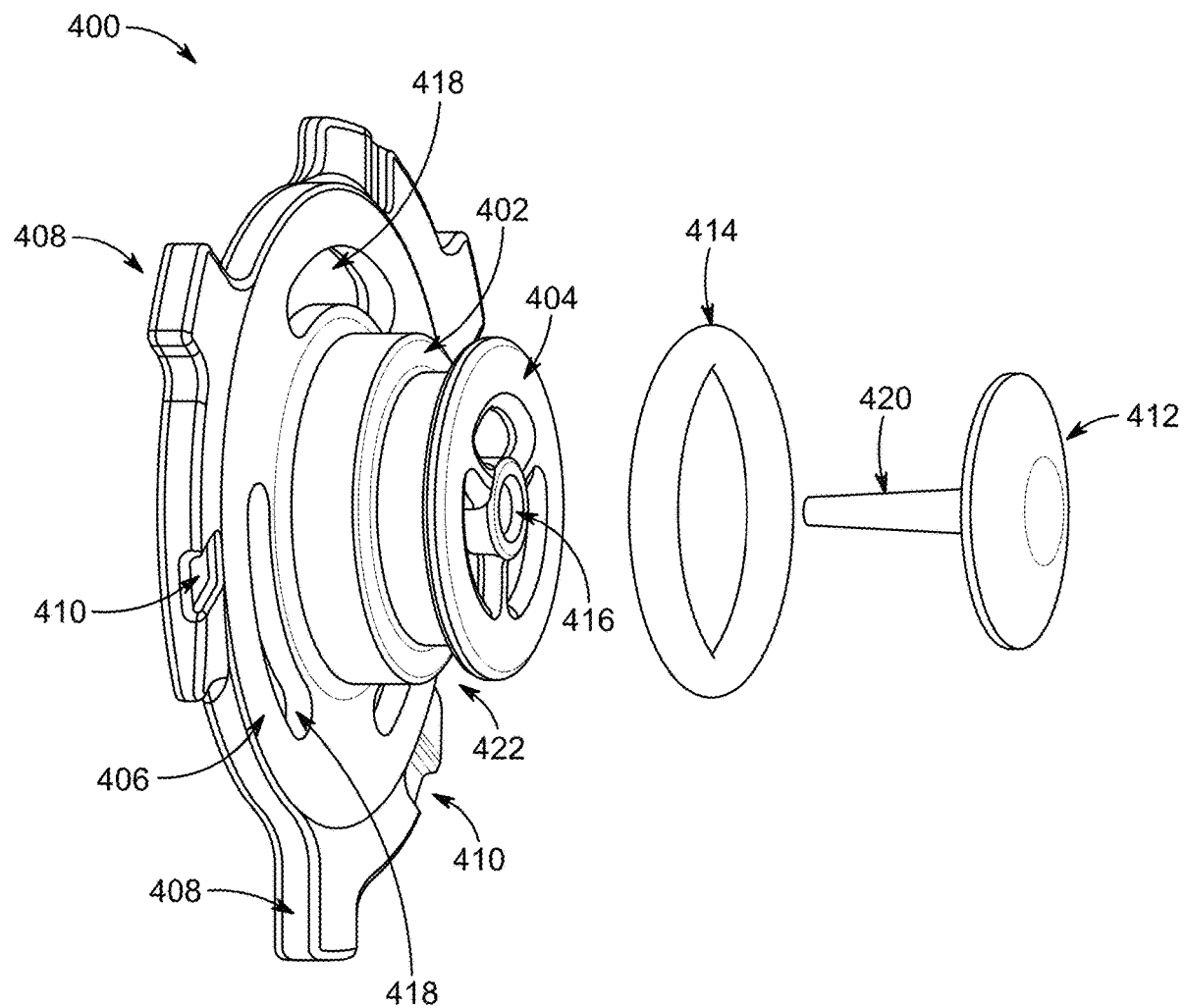
FIG. 4 is an exploded view of an inlet purge module according to an embodiment.

FIG. 4 is an exploded view of an inlet purge module 400 according to an embodiment. Inlet purge module 400 includes nozzle 402 having end 404 and flange 406. Flange 406 may include one or more tabs 408 and engagement features 410. The inlet purge module 400 further includes check valve 412, and seal 414.

Inlet purge module 400 may be used as to allow a fluid such as a purge gas (for example, nitrogen) to flow into the substrate container in which it is installed. Inlet purge module 400 may be, for example, a front inlet purge module, located near a front opening (not shown) of a FOUP.

Nozzle 402 extends to end 404. End 404 of nozzle 402 is configured to fit within a connector when the inlet purge module 400 is installed in a plate of a substrate container, such as plate 104 described above and shown in FIG. 1. Nozzle 402 includes a passage through which a fluid may be directed. When inlet purge module 400 is installed in a substrate container, nozzle 402 may extend into a connector such as connector 106, described above and shown in FIG. 1. Nozzle 402 may include a retaining feature 416 at end 404, such as a cylindrical opening to retain a portion of the check valve 412.

Inlet purge module 400 includes flange 406 surrounding nozzle 402. Flange 406 may engage with a plate (such as plate 104 described above and shown in FIG. 1) to retain and position inlet purge module 400. Flange 406 may include, for example tabs 408, and engagement features 410. Tabs 408 may interface with grooves on the plate, for example ramped grooves, to fix and position the inlet purge module 400 by rotating it when it is inserted into the recess (such as recess 108 described above and shown in FIG. 1) in the plate where it is installed and rotated. Engagement features 410 are part of a mechanical engagement resisting rotation of the inlet purge module 400 when it is fully installed in the plate. Engagement features 410 may be, for example, recesses configured to engage with corresponding detent ribs on the when the inlet purge module 400 is installed. In an embodiment, the engagement features 410 may be detent ribs on the inlet purge module 400 configured to engage recesses on the plate when installed. Flange 406 may further include one or more tool interfaces 418, for example the openings shown in FIG. 4, where a tool (not shown) may mate with inlet purge module 400 so that it may transfer rotational force to the inlet purge module 400. This may allow removal of the inlet purge module 400 without affecting the connector or the dimensions of a substrate container, allowing removal and field-servicing of the inlet purge module 400.

Check valve 412 is a valve allowing one-way flow out of nozzle 402. Check valve 412 may be, for example, an umbrella check valve. A stem 420 of the check valve 412 may include a ball, ridge, ramped portion or other feature mechanically engaging with retaining feature 416. For example, in the embodiment shown in FIG. 4, stem 420 of check valve 412 may include a conical portion pulled through an aperture that is retaining feature 416 of nozzle 402.

Seal 414 may be used to prevent leakage of gas between nozzle 402 and a connector such as connector 106 described above and shown in FIG. 1. Seal 414 may be, for example, an o-ring, an overmolded seal, a flat gasket, or other such seals. In the embodiment shown in FIG. 4, seal 414 is an o-ring, disposed in groove 422 formed in the outer surface of nozzle 402.

Figure 5:
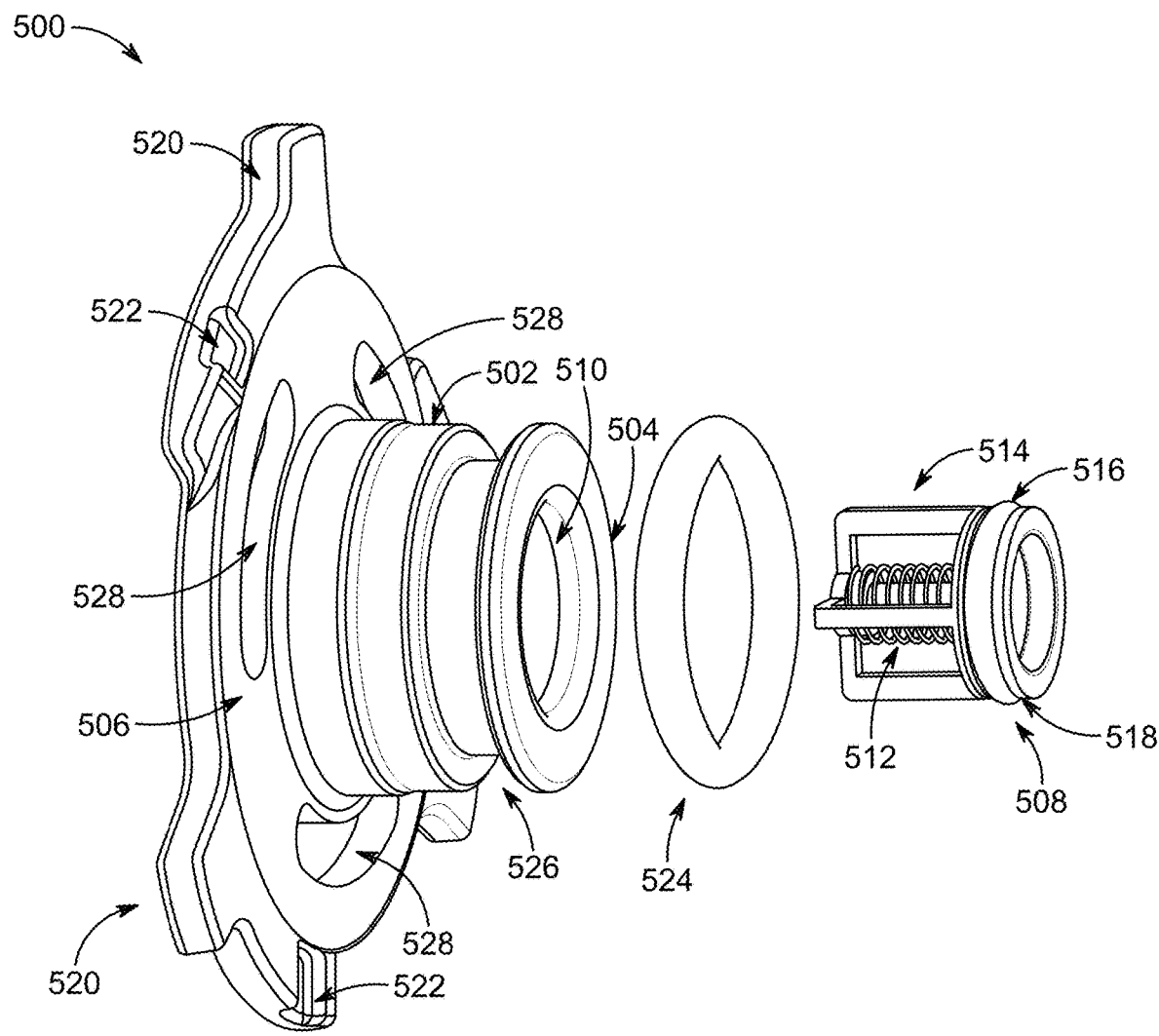
FIG. 5 is an exploded view of an outlet purge module according to an embodiment.

FIG. 5 is an exploded view of an outlet purge module 500 according to an embodiment. Outlet purge module 500 includes nozzle 502 having end 504, flange 506, and check valve 508.

Nozzle 502 extends to end 504. Nozzle 502 includes an aperture. An inner surface of the aperture through nozzle 502 may include one or more check valve engagement features 510. Check valve engagement features provide a mechanical interface between an inner surface of nozzle 502 and the check valve 508, for example to secure and position the check valve 508. Check valve engagement features 510 may include one or more channels for the ribs of cage 514 of the check valve 508 and/or one or more detent ribs or recesses configured to accept raised features on cage 514 of check valve 508.

Flange 506 may engage with a plate (such as plate 104 as described above and shown in FIG. 1) to retain and position outlet purge module 500. The flange 506 may include, for example, tabs 520 and engagement features 522. Tabs 520 may interface with grooves on the plate, for example ramped slots (such as ramped slots 604 described below and shown in FIG. 6) to allow the outlet purge module 500 to be inserted into a recess (such as recess 108 described above and shown in FIG. 1) in the plate and rotated to a position where it is fixed to the plate. Engagement features 522 may secure the outlet purge module in a position when it is rotated into the plate, for example when it is fully rotated into position within the plate. Engagement features 522 may include, for example, recesses configured to engage with corresponding detent ribs on the plate when the outlet purge module 500 is installed. In an embodiment, the engagement features 522 may be detent ribs on the outlet purge module 500 configured to engage recesses on the plate when installed. Flange 506 may further include one or more tool interfaces 528, for example the openings shown in FIG. 5 where a tool (not shown) may mate with outlet purge module 500 to rotate the outlet purge module 500. This may allow removal of the outlet purge module 500 without affecting the connector or the dimensions of a substrate container, allowing removal and field-servicing of the outlet purge module 500.

Check valve 508 is a check valve allowing the one way flow of a fluid, such as gases being purged from a substrate container such as a FOUP, from an internal space of the wafer container (not shown) into the nozzle 502. Check valve 508 may be, for example, a mechanical check valve held in place by spring 512 and a cage 514 surrounding the spring 512. Cage 514 of the may be engaged by the check valve engagement features 510 within nozzle 502. Check valve 508 may include a check valve seal 516. Check valve seal 516 is a seal configured to prevent the leakage of a fluid such as purged gases between the check valve 508 and the inner surface of nozzle 502. Check valve seal 516 may be, for example, an o-ring, a flat gasket, an overmolded seal, or other such seals. In an embodiment, check valve seal 516 is an o-ring place within a check valve seal groove 518 formed in an outer surface of the check valve.

Outlet purge module 500 may include seal 524 to prevent leakage between the inner surface of a connector and the outer surface of a nozzle when outlet purge module 500 is installed in a substrate container including the connector. The seal 524 may be, for example, a flat gasket or an overmolded seal. In an embodiment, seal 524 may be an o-ring located within a groove 526 in the outer surface of nozzle 502.

Figure 6:
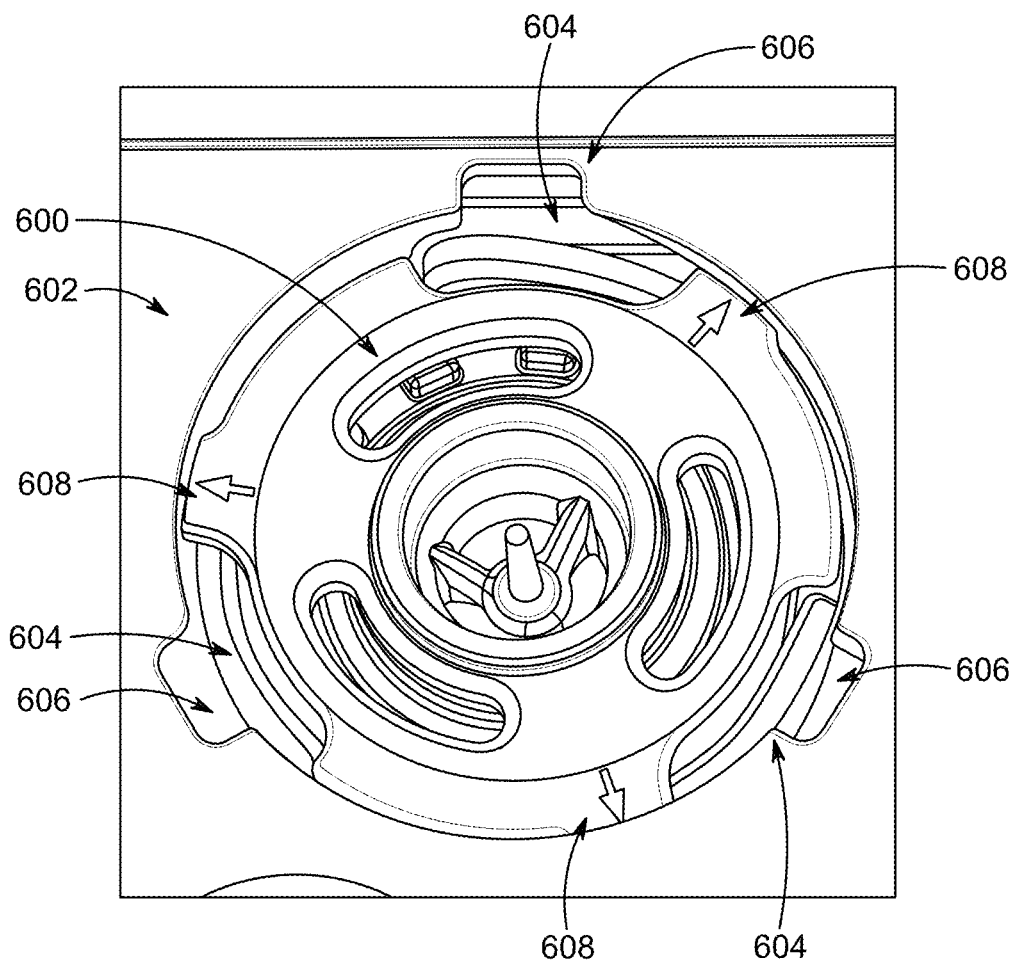
FIG. 6 is a bottom view of a purge module installed in a substrate container according to an embodiment.

FIG. 6 is a bottom view of a purge module 600 installed in a substrate container at plate 602 according to an embodiment. Plate 602 includes ramped slots 604. One or more ramped slots 604 may be used in embodiments. Each of ramped slots 604 includes an aperture 606 capable of accepting tabs 608 of the purge module 600 (such as, for example tabs 408 or 520 discussed above and shown in FIGS. 4 and 5, respectively). When the purge module 600 is rotated following insertion of tabs 608 into apertures 606, plate 602 restricts movement of purge module 600 perpendicular to the plane of plate 602. When the purge module 600 is fully rotated into position, engagement members (not shown) on the tabs (such as engagement members 410 or 522 described above and shown in FIGS. 4 and 5, respectively) and the slots may engage to restrict rotation of the purge module 600, fixing its position with respect to plate 602. The engagement may be, for example, a mating of detent ribs and recesses or other such mechanical connections.

Figure 7:
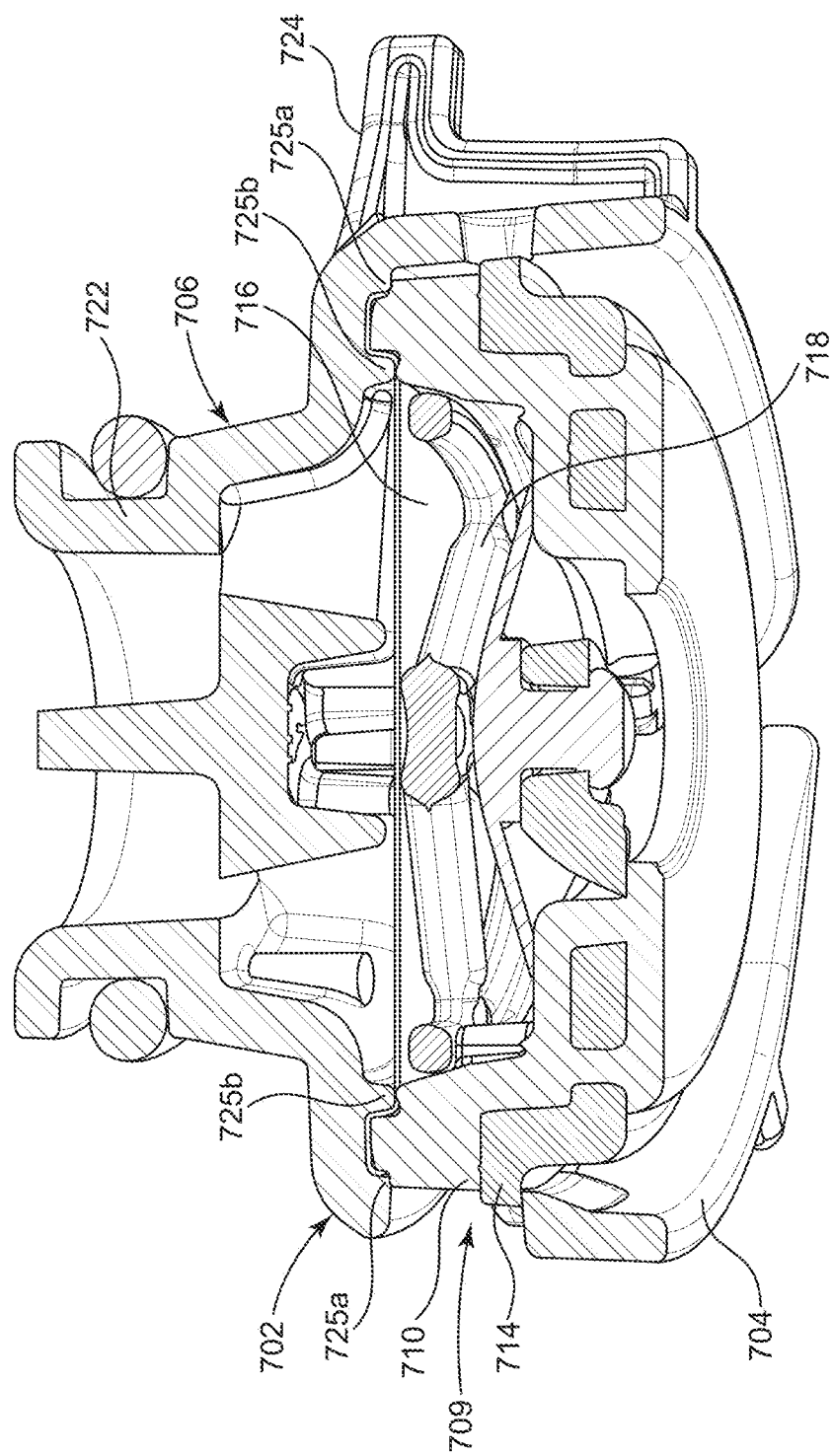
FIG. 7 is a sectional view of an inlet purge module according to an embodiment.

FIG. 7 is a sectional view of an inlet purge module 700 according to an embodiment. Purge module body 702 has first end 704 and nozzle 706 extending towards second end 708. Purge module body 702 is open from first end 704 to second end 708 such that a fluid such as a purge gas (for example, nitrogen) may flow through the purge module body 702. When inlet purge module 700 is installed in a substrate container such as the substrate container 100 shown in FIG. 1, second end 708 may extend into a connector such as connector 106 described above and shown in FIG. 1. The second end 708 may have an outer diameter smaller than the inner diameter of the connector. The nozzle 706 may extend into the connector such that seal 720 prevents leakage between the connector and the nozzle 706 of the inlet purge module 700. A seal 720 may be located on the nozzle 706, towards the second end 708. Seal 720 may be, for example, a flat gasket, an overmolded seal, or as shown in the embodiment of FIG. 7, an o-ring located in a groove 722 in the outer surface of nozzle 706. The opening at the first end 704 of purge module body 702 has an inner diameter larger than the outer diameter of grommet 709, such that a grommet 709 can be inserted into the purge module body 702 at the first end 704, as shown.

Grommet 709 is a grommet sized to fit within the first end 704 of purge module body 702, and includes check valve 712. Grommet 709 is retained within the purge module body 702 by a snap-fit relationship with features located on the purge module body 702. Check valve 712 is a check valve allowing one way flow of fluid such as a purge gas (for example, nitrogen) in a direction from the first end 704 towards the second end 708 of purge module body 702. Check valve 712 may be, for example, an umbrella check valve.

Grommet 709 may further restrict or prevent leakage between the outer diameter of grommet 709 and the inner diameter of first end 704 of purge module body 702 by the creation of a seal. The grommet 709 may include, for example, an o-ring located in an annular groove surrounding a grommet substrate or another such seal. In the embodiment depicted in FIG. 7, grommet 709 is an overmolded grommet including an elastomeric component 710 overmolded onto a substrate 714. In an embodiment, grommet 709 is made of a material or materials selected to reduce or eliminate particle generation from friction with the purge module body 702. The elastomeric component 710 can be formed from a thermoplastic elastomer which in one non-limiting example can include polybutylene terephthalate. The substrate 714 can be formed of at least one of a polycarbonate and carbon nanotubes.

In some embodiments, purge module body 702 can include a first annular protrusion 725a that contacts and compresses the elastomeric component 710 of the grommet 709 such that the grommet 709 seals against the purge module body 702. In addition to or as an alternative to the first annular 725a protrusion, the purge module body 702 may also include a second annular protrusion 725b. The second annular protrusion 725b compresses and seals filter element 716 between the elastomeric component 710 of the grommet 709 and the purge module body 702. In some embodiments, a filter grill 718 may be located between grommet 709 and purge module body 702.

Filter 716 is a filter, such as, for example, a polymer filter membrane. Filter 716 may be fixed in place by being clamped between grommet 709 and purge module body 702. In an embodiment, the interface of grommet 709 and purge module body 702 where filter 716 is clamped may include lobes and recesses corresponding to those described above and shown in Figure. Filter 716 may have a diameter that is larger than the outer diameter of purge module body 702 at second end 708. Filter 716 may have a diameter that is larger than the inner diameter of a connector used in a substrate container into which inlet purge module 700 is to be installed.

Purge module body 702 may further include tabs 724 to engage with a substrate container when the inlet purge module body 702 is installed into the substrate container. Inlet purge module 700 may include one or more of tabs 724. Tabs 724 may engage with slots, for example similar to ramped slots 1004 described below and shown in FIG. 10, to position and secure inlet purge module 700 in a plate of a substrate container, such as plate 1002 described above and shown in FIG. 10.

Figure 8A:
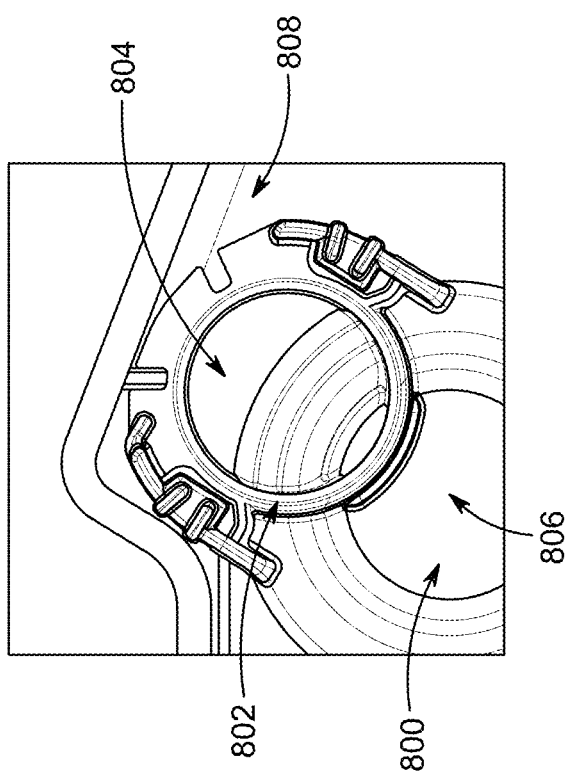
FIG. 8A is a top view of a connector when assembled with a shell of a substrate container according to an embodiment.

FIG. 8A is a top view of a connector 800 when assembled with a shell 808 of a substrate container according to an embodiment. Connector 800 includes an outlet 802 having an opening 804. The center of opening 804 is offset from a center 806 of the connector 800 where it extends through the shell 808 and the plate (not shown). Connector 800 may be used as a connector at, for example, a rear of a FOUP, opposite the open end of the internal space of the FOUP.

Figure 8B:
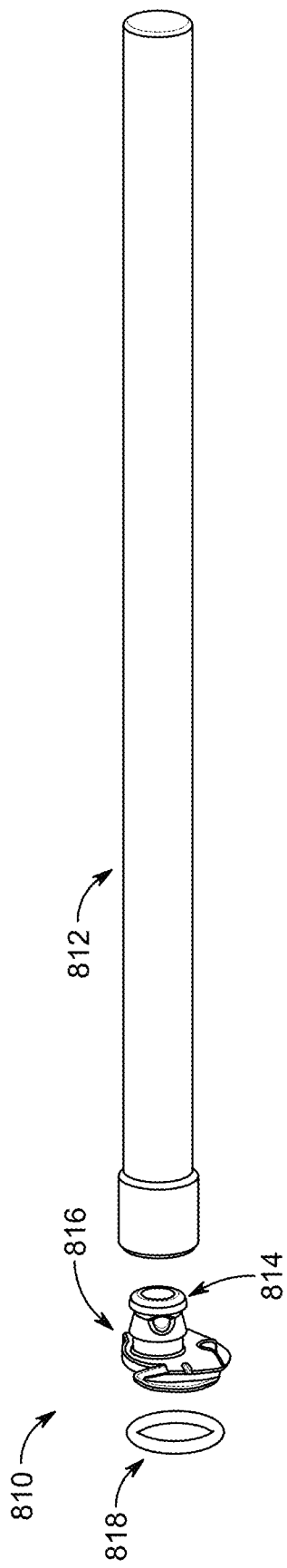
FIG. 8B is an exploded view of a diffuser tube and a connector according to an embodiment.

FIG. 8B is an exploded view of a diffuser tube assembly 810 for use with the connector 800 according to an embodiment. Diffuser tube assembly 810 includes diffuser tube 812, diffuser tube interface 816, and seal 818. Diffuser tube interface 816 includes engagement features 814 that may mechanically interface with diffuser tube 812 to fix diffuser tube 812 to diffuser tube interface 816. Diffuser tube interface 816 may be used to join diffuser tube 812 to outlet 802 to receive fluid flow from the outlet 804. Engagement features 814 may be, for example, barbs to provide a friction fit, tabs or flanges to provide a snap fit, or other such mechanical engagement. Diffuser tube interface 816 includes a path allowing a fluid such as a purge gas (for example, nitrogen) to flow from opening 804 to the diffuser tube 812. Diffuser tube interface 816 may have an end, opposite the end having engagement features 814, which may be inserted into opening 804. Diffuser tube 812 may be joined to diffuser tube interface 816 by, for example, mechanical engagement, for example via barbs on diffuser tube interface to provide a friction fit or tabs or flanges to provide a snap fit. Diffuser tube 812 may be joined to diffuser tube interface 816 such that diffuser tube 812 may be manually removed, for example for replacement or servicing such that the diffuser is field-serviceable. Seal 818 may be included to reduce or prevent leakage between the opening 804 and diffuser tube interface 816. Seal 818 may be, for example, a flat gasket, an overmolded seal, or in the embodiment shown in FIG. 8B, an o-ring. Diffuser tube 812 distributes the fluid throughout the internal space of the substrate container such as a FOUP. The one or more diffuser tube engagement features 814 may be, for example, ridges corresponding to ridges inside an opening (not shown) of diffuser tube 812, threading for a screw, or the like.

Figure 9:
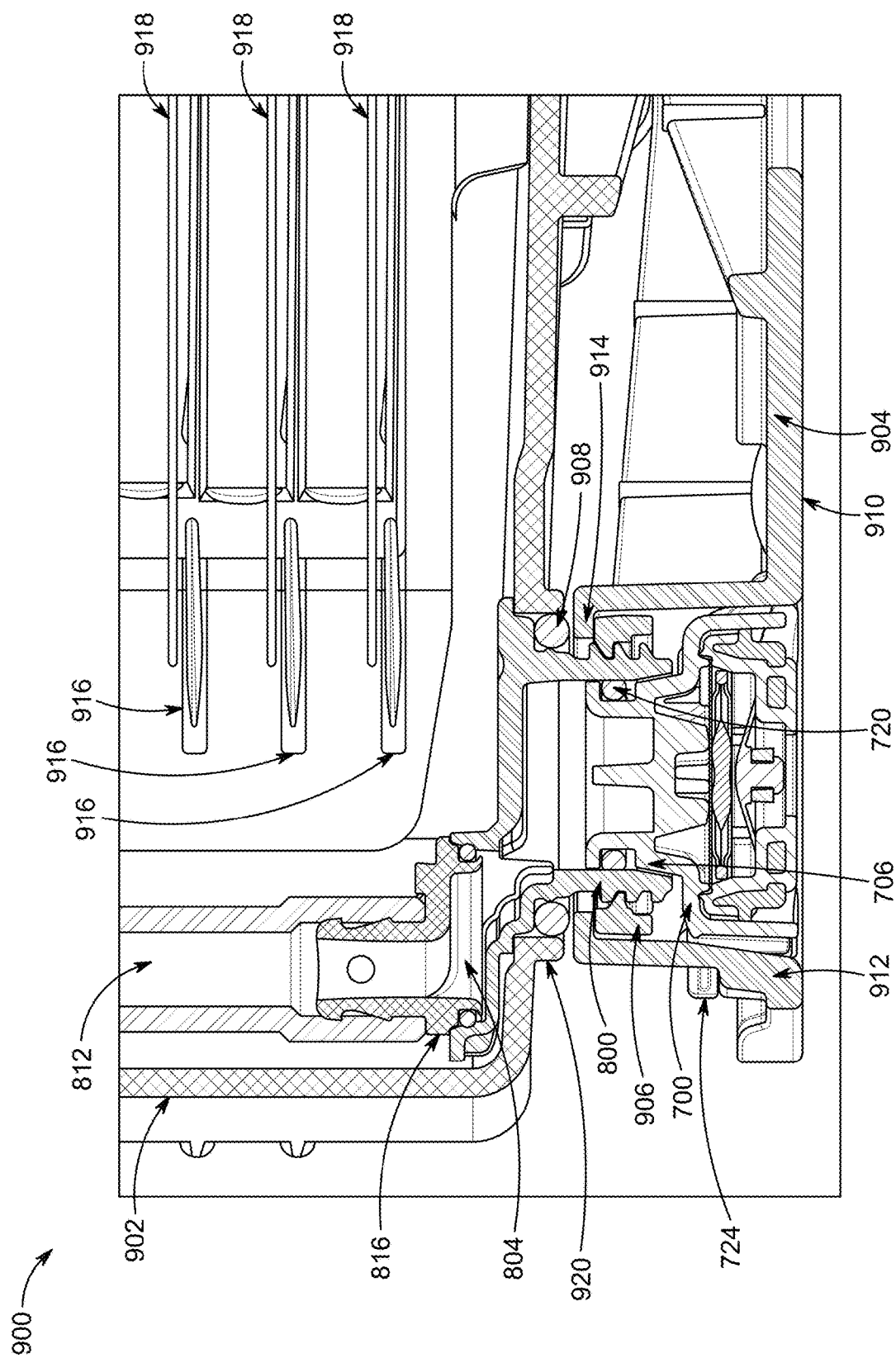
FIG. 9 is a sectional view of a substrate container including a connector according to FIGS. 8A and 8B and an inlet purge module according to FIG. 7, according to an embodiment.

FIG. 9 is a sectional view of a substrate container 900 including a connector 800 according to FIGS. 8A and 8B and an inlet purge module 700 according to FIG. 7, according to an embodiment.

Substrate container 900 includes shell 902. Shell 902 defines an interior space and has an interior surface facing the interior space. The interior of shell 902 may include one or more shelves 916 projecting from sides of the interior surface of shell 902. The shelves may each support a wafer 918, for example during processing of semiconductor wafers. The interior space may be open on one side, where wafers 918 may be loaded into the shell onto shelves 916. This open side of the shell may be covered by, for example a door. Shell 902 includes one or more shell openings 920. The shell openings 920 may correspond to where shell 902 is joined to plate 904 via connectors such as connector 800. Each of shell openings 920 may be circular or approximately circular, within manufacturing tolerances and location constraints such as being towards an enclosed rear end of the internal space away from the open side of the internal space.

Substrate container 900 also includes plate 904. Plate 904 may be, for example, a conveyor plate such as that of a FOUP. Plate 904 may include surface 910 facing outwards from shell 902 when shell 902 and plate 904 are assembled. Surface 910 may include one or more alignment recesses used to position and support the substrate container 900, for example during transit through a facility or during wafer processing. Surface 910 may further include one or more recesses 912, which recess from surface 910 inwards towards shell 902. Recesses 912 may correspond to where connectors 800 are used to join shell 902 and plate 904. Plate openings 914 may be located in the recesses 912, allowing connector 800 to at least partially extend through the plate 904. Each of plate openings 914 may be circular or approximately circular, within manufacturing tolerances and location constraints.

Connector 800 extends through shell 902 and plate 904, and on the side of plate 904 opposite the side facing shell 902, nut 906 is threaded onto connector 800 to secure connector 800 in place and secure shell 902 to plate 904. When nut 906 is threaded onto connector 800, nut 906 may be located entirely within recess 912 from surface 910 of plate 904. The threading of nut 906 and/or connector 800 may include one or more locking features such as, for example serrated surfaces, bumps, scalloping, or other such features to restrict rotation when the nut 906 and the connector 800 are threaded together. The offset of opening 802 from the center of connector 800 may allow connector 800 to restrict the movement of shell 902 relative to plate 904 when the nut 906 is threaded onto the opposite end of connector 800. A portion of connector 800 may have an outer diameter less than the inner diameter of the shell opening 920 and the plate opening 914 such that it may extend through shell 902 and plate 904 into recess 912 of the plate 904. This portion of connector 800 may include the threaded end onto which nut 906 is threaded.

Seal 908 is located between shell 902, plate 904, and connector 800. Seal 908 is a seal configured to prevent leakage between the shell opening, plate opening, and connector 800 that could allow gas to enter or exit the interior of shell 902. Seal 908 may be, for example, a flat gasket, an overmolded seal, or as shown in the embodiment of FIG. 9, an o-ring. In the embodiment shown in FIG. 9, when shell 902, plate 904, and connector 800 are assembled and nut 906 is threaded onto connector 800 and tightened, seal 908 is compressed by shell 902 and plate 904 such that seal 908 presses against each of shell 902, plate 904, and connector 800.

The offset of opening 804 of connector 800 from the center of connector 800 allows diffuser tube 812 to extend vertically without interfering with shelves 916 or wafers 918 sitting on those shelves 916 during use of the substrate container 900.

Inlet purge module 700 may be installed in plate 904, for example, by inserting tabs 724 into slots (not shown) in plate 904 and rotating the inlet purge module. The second end 708 and a portion of nozzle 706 may extend into connector 800, with seal 720 between the exterior of nozzle 706 and the interior of connector 800.

Figure 10:
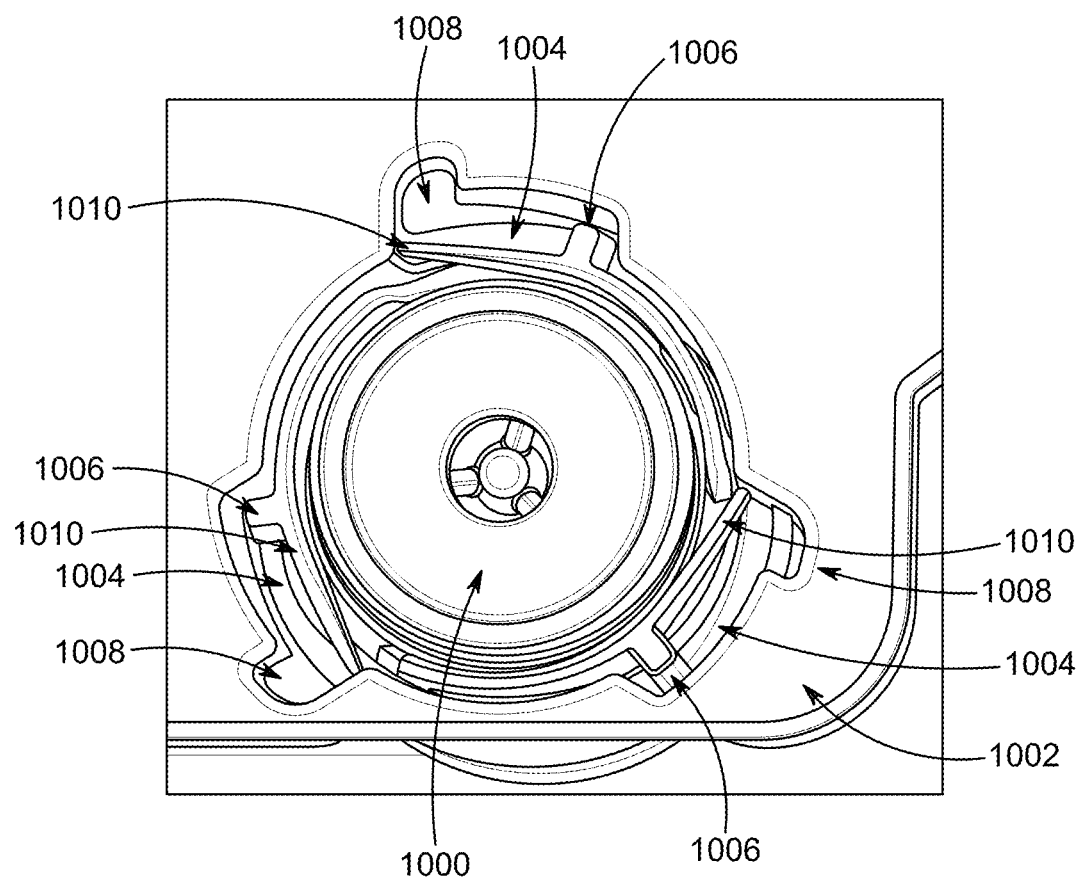
FIG. 10 is a bottom view of a purge module installed in a substrate container according to an embodiment.

FIG. 10 is a bottom view of a purge module 1000 installed in a plate 1002 of a substrate container according to an embodiment. Purge module 1000 may be an inlet purge module such as inlet purge module 700 shown in FIG. 7 and described above. Plate 1002 may have one or more ramped slots 1004 configured to accept tabs 1006 of purge module 1000 in a first rotational position and retain the tabs 1006 in a second rotational position as shown. The ramped slots 1004 may include, for example, enlarged apertures 1008 to accept the tabs 1006 and retain the tabs 1006 at constricted portions of the ramped slots 1004. Fingers 1010 may extend from each of the tabs 1006. When the purge module 1000 is rotated to the second rotational position as shown in FIG. 10, the fingers 1010 may contact an inside of enlarged apertures 1008, mechanically interfering with rotation of the purge module 1000 in a direction that would allow removal of the purge module 1000 from the plate 1002. The fingers 1010 may be pressed inwards by a tool (not shown) to remove this mechanical interference and allow rotation of the purge module 1000 to allow its removal. This may allow the purge module 1000 to be removed and field-serviced without affecting connectors of the substrate container or the dimensions of the substrate container.

Aspects:

It is understood that any of aspects 1-18 can be combined with any of aspects 19-20.

Aspect 1. A substrate container, comprising:
a container shell including a wall and an interior space defined by the wall, the container shell further including a shell opening having a first inner diameter;
a plate configured to be fixed to the shell, the plate including a surface, a recess from the first surface, and a plate opening having a second inner diameter located within the recess;
a connector including a portion that has an outer diameter smaller than the first and second inner diameters, a hollow portion having a third inner diameter, a first end having an outer diameter larger than the first inner diameter, and a second end having threading;
a nut having threading configured to engage the threading on the connector; and
a seal disposed between the container shell and the plate,
wherein the first end of the connector is located on a first side of the container shell, and the second end of the connector, the seal and the plate are located on a second side of the container shell opposite the first side of the container shell,
wherein the connector extends through the shell opening and the plate opening, and
wherein when the nut is threaded onto the connector and tightened, the seal contacts each of the container shell, the plate, and the connector.

Aspect 2. The substrate container according to aspect 1, wherein at least one of the threading on the connector and the threading on the nut includes a locking mechanism.

Aspect 3. The substrate container according to any of aspects 1-2, wherein the seal is an o-ring.

Aspect 4. The substrate container according to any of aspects 1-3, wherein the connector further comprises a filter membrane located at the first end of the connector, a filter grill, and a filter cap configured to mechanically engage the first end of the connector and secure the filter grill and filter membrane to the end of the connector.

Aspect 5. The substrate container according to any of aspects 1-4, further comprising a front purge module including a check valve and a nozzle including an end having an outer diameter smaller than the third inner diameter, wherein the front inlet purge module is positioned such that the end of the nozzle is within the hollow portion of the connector.

Aspect 6. The substrate container according to aspect 5, wherein the front purge module includes a plurality of tabs and the plate includes a plurality of ramped slots configured to accept the tabs of the front inlet purge module.

Aspect 7. The substrate container according to any of aspects 5-6, wherein the plurality of tabs each include a recess and the plate includes a plurality of detent ribs configured to engage the recesses.

Aspect 8. The substrate container according to any of aspects 1-7, wherein the connector includes an outlet having an opening, wherein a center of the opening is offset from a center of the inner diameter of the connector.

Aspect 9. The substrate container according to aspect 8, wherein a diffuser tube is connected to the outlet.

Aspect 10. The substrate container according to any of aspects 1-9, wherein when the nut is threaded onto the connector, the nut and the second end of the connector are located entirely within the recess.

Aspect 11. The substrate container according to aspect 10, further comprising a filter membrane located within the recess.

Aspect 12. The substrate container according to aspect 11, wherein the filter membrane has a diameter that is larger than the inner diameter of the connector.

Aspect 13. The substrate container according to any of aspects 1-12, further comprising a rear purge inlet module including:
- a grommet including a check valve;
- a filter membrane;
- a grill configured to support the filter membrane; and
- a rear purge inlet module body, including a portion having an inner diameter larger than an outer diameter of the grommet and configured to accept the grommet, and a nozzle having an outer diameter smaller than the third inner diameter, and wherein an end of the nozzle is located within the connector.

Aspect 14. The substrate container according to aspect 13, wherein the grommet is an overmolded grommet including a substrate and an elastomeric component.

Aspect 15. The substrate container according to any of aspects 13-14, wherein the check valve is an umbrella valve.

Aspect 16. The substrate container according to any of aspects 13-15, wherein the filter membrane has a diameter that is larger than the third inner diameter.

Aspect 17. The substrate container according to any of aspects 13-16, wherein the rear inlet purge module body includes a plurality of tabs and the plate includes a plurality of ramped slots each configured to accept one of the plurality of tabs.

Aspect 18. The substrate container according to aspect 17, wherein the rear inlet purge module body includes a plurality of fingers configured to engage the plate to prevent rotation of the rear purge inlet module when the plurality of tabs are fully within the plurality of slots.

Aspect 19. A front opening unified pod (FOUP), comprising:
- a shell including a front opening and an interior space;
- a plate configured to be fixed to the shell;
- a connector including a threaded end having an inner diameter, the connector extending through the shell and the plate and secured via a nut at the threaded end; and
- a replaceable, field-serviceable inlet or outlet module including a check valve and a nozzle having an end with an outer diameter smaller than the inner diameter of the threaded end of the connector, wherein the end of the nozzle is located within the inner diameter of the threaded end of the connector.

Aspect 20. The FOUP according to aspect 19, wherein the replaceable, field-serviceable inlet or outlet module is one selected from the group of an inlet purge module wherein the check valve is configured to allow flow into the shell, or an outlet purge module wherein the check valve is configured to allow flow out of the shell.

Aspect 21. The FOUP according to any of aspects 19-20, wherein a portion of the replaceable, field-serviceable inlet or outlet module protrudes from the plate.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

The invention claimed is:

1. A substrate container, comprising:
   - a container shell including a wall and an interior space defined by the wall, the container shell further including a shell opening having a first inner diameter;
   - a plate configured to be fixed to the shell, the plate including a surface, a recess from the first surface, and a plate opening having a second inner diameter located within the recess;
   - a connector including a portion that has an outer diameter smaller than the first and second inner diameters, a hollow portion having a third inner diameter, a first end having an outer diameter larger than the first inner diameter, and a second end having threading;
   - a nut having threading configured to engage the threading on the connector; and
   - a seal disposed between the container shell and the plate, wherein the first end of the connector is located on a first side of the container shell, and the second end of the connector, the seal and the plate are located on a second side of the container shell opposite the first side of the container shell,
   - wherein the connector extends through the shell opening and the plate opening, and
   - wherein when the nut is threaded onto the connector and tightened, the seal contacts each of the container shell, the plate, and the connector.

2. The substrate container of claim 1, wherein at least one of the threading on the connector and the threading on the nut includes a locking mechanism.

3. The substrate container of claim 1, wherein the seal is an o-ring.

4. The substrate container of claim 1, wherein the connector further comprises a filter membrane located at the first end of the connector, a filter grill, and a filter cap configured to mechanically engage the first end of the connector and secure the filter grill and filter membrane to the end of the connector.

5. The substrate container of claim 1, further comprising a front purge module including a check valve and a nozzle including an end having an outer diameter smaller than the third inner diameter, wherein the front inlet purge module is positioned such that the end of the nozzle is within the hollow portion of the connector.

6. The substrate container of claim 5, wherein the front purge module includes a plurality of tabs and the plate includes a plurality of ramped slots configured to accept the tabs of the front inlet purge module.

7. The substrate container of claim 6, wherein the plurality of tabs each include a recess and the plate includes a plurality of detent ribs configured to engage the recesses.

8. The substrate container of claim 1, wherein the connector includes an outlet having an opening, wherein a center of the opening is offset from a center of the inner diameter of the connector.

9. The substrate container of claim 8, wherein a diffuser tube is connected to the outlet.

10. The substrate container of claim 1, wherein when the nut is threaded onto the connector, the nut and the second end of the connector are located entirely within the recess.

11. The substrate container of claim 10, further comprising a filter membrane located within the recess.

12. The substrate container of claim 11, wherein the filter membrane has a diameter that is larger than the inner diameter of the connector.

13. The substrate container of claim 1, further comprising a rear purge inlet module including:
 a grommet including a check valve;
 a filter membrane;
 a grill configured to support the filter membrane; and
 a rear purge inlet module body, including a portion having an inner diameter larger than an outer diameter of the grommet and configured to accept the grommet, and a nozzle having an outer diameter smaller than the third inner diameter, and wherein an end of the nozzle is located within the connector.

14. The substrate container of claim 13, wherein the grommet is an overmolded grommet including a substrate and an elastomeric component.

15. The substrate container of claim 13, wherein the check valve is an umbrella valve.

16. The substrate container of claim 13, wherein the filter membrane has a diameter that is larger than the third inner diameter.

17. The substrate container of claim 13, wherein the rear inlet purge module body includes a plurality of tabs and the plate includes a plurality of ramped slots each configured to accept one of the plurality of tabs.

18. The substrate container of claim 17, wherein the rear inlet purge module body includes a plurality of fingers configured to engage the plate to prevent rotation of the rear purge inlet module when the plurality of tabs are fully within the plurality of slots.

19. A substrate container, comprising:
 a shell including a front opening and an interior space;
 a plate configured to be fixed to the shell;
 a connector including a threaded end having an inner diameter, the connector extending through the shell and the plate and secured via a nut at the threaded end; and
 a replaceable, field-serviceable inlet or outlet module including a check valve and a nozzle having an end with an outer diameter smaller than the inner diameter of the threaded end of the connector, wherein the end of the nozzle is located within the inner diameter of the threaded end of the connector.

20. The substrate container of claim 19, wherein the replaceable, field-serviceable inlet or outlet module is one selected from the group of an inlet purge module wherein the check valve is configured to allow flow into the shell, or an outlet purge module wherein the check valve is configured to allow flow out of the shell.

\* \* \* \* \*